United States Patent
Flock (10) Patent No.: US 7,250,692 B2
(45) Date of Patent: Jul. 31, 2007

(54) CONTROL DEVICE

(75) Inventor: Horst Mathias Flock, Reutlingen (DE)

(73) Assignee: AFL Europe GmbH, Frickenhausen (DE)

( * ) Notice: Subject to any disclaimer, the term of this patent is extended or adjusted under 35 U.S.C. 154(b) by 214 days.

(21) Appl. No.: 10/847,634

(22) Filed: May 17, 2004

(65) Prior Publication Data

US 2005/0057099 A1    Mar. 17, 2005

(30) Foreign Application Priority Data

May 23, 2003   (DE) .............................. 103 25 371

(51) Int. Cl.
  *B60L 1/00*        (2006.01)
(52) U.S. Cl. ...................................... 307/9.1
(58) Field of Classification Search ................ 307/9.1, 307/147
  See application file for complete search history.

(56) References Cited

U.S. PATENT DOCUMENTS 5,740,002 A * 4/1998 Jenss et al. ................ 361/93.9
6,058,032 A * 5/2000 Yamanaka et al. ............. 363/71
6,326,761 B1  12/2001 Tareilus

FOREIGN PATENT DOCUMENTS

DE     197 21 386     6/1998
DE     199 13 450     9/2000

* cited by examiner

*Primary Examiner*—Robert L. DeBeradinis
(74) *Attorney, Agent, or Firm*—Lipsitz & McAllister, LLC (57) ABSTRACT

In order to design the circuit arrangement for a control device for units connected to an electric supply network of a motor vehicle as load, comprising a control signal generator for generating a pulse-width modulated control signal, a power output stage with at least one power switch for supplying the respective load, wherein the power switch can be activated in a pulse-width modulated manner by the control signal applied to a control input thereof and has connections for connection to the supply network as well as to the load, one of these connection being formed by at least one conductor element, such that, on the one hand, line inductances which are as low as possible occur and, on the other hand, electric resistances which are also as low as possible it is suggested that a current connection carrier on the network side and a current connection carrier on the load side be provided in the at least one power output stage and that the at least one conductor element of each power switch be connected to one of the current supply carriers by means of a respective clamping connection.

30 Claims, 7 Drawing Sheets

FIG.1

CONTROL DEVICE

The present disclosure relates to the subject matter disclosed in German application No. 103 25 371.8 of May 23, 2003, which is incorporated herein by reference in its entirety and for all purposes.

The invention relates to a control for units connected to an electric supply system or network of a motor vehicle, comprising a control signal generator for generating a pulse-width modulated control signal, a power output stage with at least one power switch for supplying the respective load, wherein the power switch can be activated in a pulse-width modulated manner by the control signal applied to a control input thereof and has connections, one of which is formed by at least one conductor element, for connection to the supply network as well as to the load.

Control devices of this type are known from the state of the art. In their case, the problem, in particular when large amounts of current are intended to flow, is to design the circuit arrangement such that, on the one hand, line inductances which are as low as possible occur and, on the other hand, electric contact resistances which are also as low as possible.

This object is accomplished in accordance with the invention, in a control of the type specified at the outset, in that a current connection carrier on the network side and a current connection carrier on the load side are provided in the at least one power output stage and that the at least one conductor element of each power switch is connected to one of the current connection carriers by means of a respective clamping connection.

The advantage of this solution is to be seen in the fact that as a result of the current connection carriers being provided it is possible, on the one hand, to have large amounts of current flowing with low resistances and, on the other hand, as a result of the clamping connection being provided for the connection of the conductor element to one of the current connection carriers a secure electrical connection can be provided between the current connection carrier and the conductor element of the power switch which is suitable for large amounts of current.

The power switch may have, for example, two pairs of conductor elements which can be connected to the respective current connection carrier via a clamping connection.

The power switch normally comprises as additional connection a connection flange which is advantageously connected to the respectively other current connection carrier.

In this respect, the connection flange preferably abuts in a pressed manner on the respectively other current connection carrier.

Such a pressed abutment of the connection flange on the respectively other current connection carrier is brought about, in particular, by a clamping element or screw element exerting a pressing force.

In order to be able to arrange the power switches with a line inductance which is as low as possible, it is preferably provided for the clamping connection to have a receiving means for the conductor element which faces the other current connection carrier.

Furthermore, the current connection carrier on the network side and the current connection carrier on the load side are—in particular, in order to achieve a spatially compact construction—arranged so as to extend parallel to one another.

This is particularly advantageous when not only one power switch but rather a plurality of power switches connected in parallel is provided and these are arranged in a row extending parallel to the current connection carriers.

In order to achieve a sufficiently good interference suppression of the control device, a current connection carrier on the ground side is provided in a preferred embodiment, wherein at least one interference suppression capacitor, which serves the purpose of flattening voltage peaks which have a retroactive effect on the supply network, is provided between the current connection carrier on the network side and the current connection carrier on the ground side.

In this respect, the at least one interference suppression capacitor is preferably designed such that it has two capacitor connections, at least one of which is designed as a conductor element and connected to one of the current connection carriers by at least one clamping connection.

This also makes a simple and compact assembly of the at least one interference suppression capacitor possible.

In this respect, the other capacitor connection is also preferably designed as a conductor element and connected to the other one of the current connection carriers by means of a respective clamping connection.

In order to achieve as optimum an interference suppression effect as possible with line inductances which are as low as possible it is preferably provided for the current connection carrier on the network side and the current connection carrier on the ground side to be arranged so as to be located next to one another in spaced relationship so that it is possible to connect the interference suppression capacitors to the two current connection carriers with lines which are as short as possible.

In this respect, it is particularly favorable when the clamping connections on the current connection carriers are arranged at a distance which corresponds approximately to a distance between the conductor elements exiting from the at least one interference suppression capacitor. As a result, it is possible to connect the conductor elements of the interference suppression capacitors to the current connection carriers without large line inductances.

The current connection carrier on the network side and the current connection carrier on the ground side are preferably insulated electrically in relation to one another by means of an insulating member and, in particular, kept at a distance by the insulating member.

The inventive concept is particularly advantageous with respect to the interference suppression capacitors provided when several interference suppression capacitors are provided since these several interference suppression capacitors are then arranged in a row extending parallel to the current connection carriers.

In addition, a current connection carrier on the ground side is provided in the control device, in particular, when the loads are inductive loads, wherein at least one freewheeling diode is provided between the current connection carrier on the load side and the current connection carrier on the ground side, this freewheeling diode being in a position to allow a freewheeling current to flow between the current connection carrier on the load side and the current connection carrier on the ground side.

In this respect, it is particularly favorable when the at least one freewheeling diode has two diode connections and when at least one of the diode connections is designed as a conductor element and connected to one of the current connection carriers by means of a respective clamping connection.

In this respect, the other diode connection is preferably designed as a connection flange and connected to the respectively other current connection carrier via this.

The connection flange is expediently connected to the current connection carrier in such a manner that the connection flange abuts in a pressed manner on the respective current connection carrier.

It is particularly advantageous, in particular, in order to be able to connect the at least one diode with line inductances which are as low as possible when the clamping connection has a receiving means facing the other current connection carrier.

It is particularly favorable for a compact mode of construction when the current connection carrier on the load side and the current connection carrier on the ground side extend parallel to one another.

Particularly when large amounts of current are intended to be absorbed by the freewheeling diodes, a plurality of freewheeling diodes is preferably provided and these are arranged in a row extending parallel to the current connection carriers.

With respect to the design of the clamping connections, no further details have been given in conjunction with the embodiments described thus far.

It is, for example, particularly favorable when the clamping connection is formed by two clamping jaws of a clamping member so that the clamping connection may be realized very simply by means of the clamping member with its clamping jaws.

This solution can be realized particularly easily from a constructional point of view when the clamping jaws are integrally formed on the clamping member. The advantage of this solution is also to be seen, in particular, with respect to the electrical connection since both clamping jaws can absorb current without any transitional resistance between clamping jaws and clamping member on account of their integral connection to the clamping member.

In order to be able to produce clamping members of this type particularly easily and inexpensively it is preferably provided for the clamping member to be formed by a section of a profiled rail which has at least one groove and forms the clamping jaws with groove walls arranged on both sides of the groove.

It is preferably provided, in particular, in the case of a plurality of power switches or interference suppression capacitors or freewheeling diodes for each current connection carrier to be provided with a plurality of clamping members.

A solution which is particularly expedient with respect to its design provides for the current connection carrier itself to be designed as a profiled rail forming the clamping members.

In the case of a plurality of clamping members as part of the profiled rail, these clamping members may be realized particularly easily by means of separate groove wall sections arranged on at least one side of the groove.

These groove wall sections may be formed particularly easily in the case of a profiled rail by means of slits extending in the respective groove wall transversely to the longitudinal direction of the groove.

Alternatively or in addition to the inventive solution described above, it is provided in accordance with the invention, in a control device of the type described at the outset, for a ground connection from the supply network to a unit having the load to be guided exclusively via the power output stage of the control device. This design of the inventive solution has the great advantage that, with it, it is possible to filter and eliminate interferences in the area of the power output stage efficiently whereas in the case of a direct ground connection between the supply network and the unit and a branch connection for the ground connection of the control device such an efficient filtering and interference suppression is not possible.

It is particularly favorable when the ground connection is guided via a current connection carrier of the control device on the ground side.

One advantageous solution for this purpose provides for a ground line to be guided from the supply network to the current connection carrier on the ground side and for a ground line to be guided from the current connection carrier on the ground side to the unit having the load.

Additional features and advantages of the invention are the subject matter of the following description as well as the drawings illustrating several embodiments.

Figure 1:
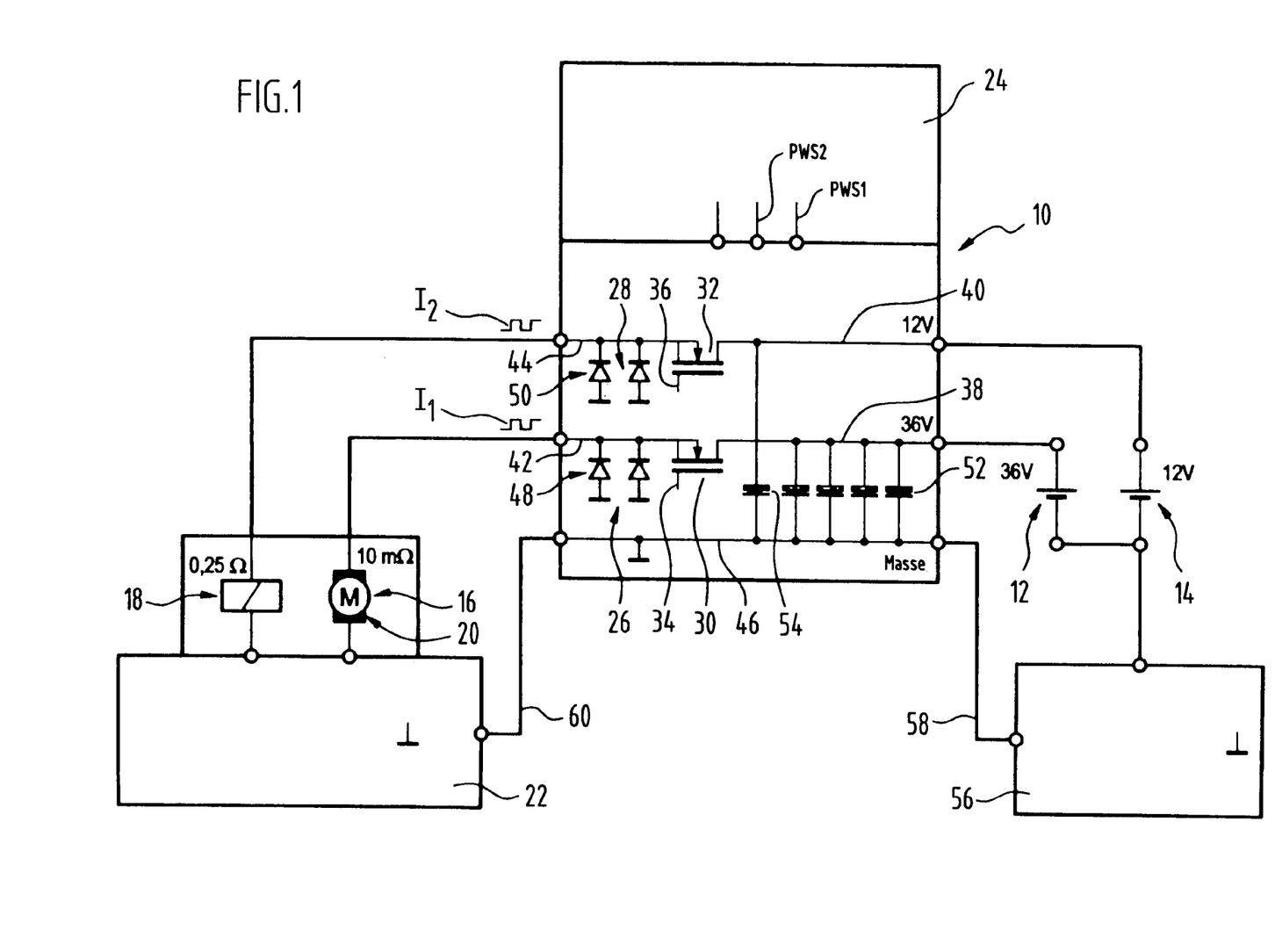
FIG. 1 shows a schematic illustration of an inventive control device, arranged between supply networks of a vehicle and a unit of a vehicle.

One embodiment of an inventive control device designated as a whole as 10 is connected, for example, to a first electric supply network 12 and a second electric supply network 14 of a motor vehicle not illustrated in the drawings and serves the purpose of activating a first load 16 and a second load 18, wherein the first load 16 is, for example, a starter motor of a starter 20 for an internal combustion engine 22 of the motor vehicle and the second load 18 is a starter solenoid of the starter 20.

In order to drive the first load 16 and the second load 18, the control device 10 is provided with a control signal generator which is designated as a whole as 24 and is in a position to activate, by means of pulse-width modulated control signals PWS1 and PW2, not only a first output stage 26 for driving the first load 16 on the first supply network 12 but also a second output stage 28 for driving the second load 18 on the second supply network 14, each of which supplies current I1 and I2, respectively, for feeding to the first load 16 and the second load 18, respectively, this current being controllable by pulse width modulation.

In order to generate the current I1 and I2, respectively, controlled by pulse width modulation, each of the power output stages 26 and 28 comprises a plurality of power switches 30 and 32, respectively, which are connected in parallel and have a control input 34 and 36, respectively, which can be activated by the control signal generator 24 with the control signals PWS1 and PWS2 in order to control with these power switches 30 and 32, respectively, current flowing from a current connection carrier 38 and 40, respectively, on the network side to a current connection carrier 42 and 44, respectively, on the load side by switching on and off in accordance with the control signals PWS1 and PWS2 at the control inputs 34 and 36, respectively.

In addition, freewheeling diodes 48 and 50 which are connected in parallel are provided between the current connection carrier 42 and 44, respectively, on the load side and ground at a current connection carrier 46 of the power output stages 26, 28 on the ground side, these freewheeling diodes taking over any freewheeling current occurring when the power switches 30 and 32, respectively, are switched off on account of an inductance of the respective load 16 or 18.

Furthermore, interference suppression capacitors 52 and 54 which are connected in parallel are arranged in each of the power output stages 26 and 28, respectively, between the current connection carrier 38 and 40, respectively, on the network side and the current connection carrier 46 on the ground side.

In accordance with the invention, the internal combustion engine 22 is not connected directly to a vehicle body 56 of the motor vehicle in order to provide a ground connection between the first network 12 and the second network 14 but rather a ground line 58 is guided from the vehicle body 56 to the current connection carrier 46 on the ground side in the inventive control device 10 and a ground line 60 is guided from the current connection carrier 46 on the ground side to the internal combustion engine 22 so that the interference suppression capacitors 52 and 54 are connected to the respective load 16 and 18 without any stray inductance and with line paths which are as short as possible and, therefore, have a low inductance in order to achieve as optimum an effect as possible of the interference suppression capacitors 52 and 54, respectively.

The electrical configuration of such a power output stage 26 and 28, respectively, is illustrated once again with the example of the power output stage 26 in FIG. 2 to FIG. 13 on the basis of a circuit diagram, wherein the power output stage 26 comprises, for example, four power switches $30_1$ to $30_4$, for example, semiconductor switches, in particular, field effect transistors and similar semiconductors, which can be controlled via their control inputs $34_1$ to $34_4$.

Figure 2:
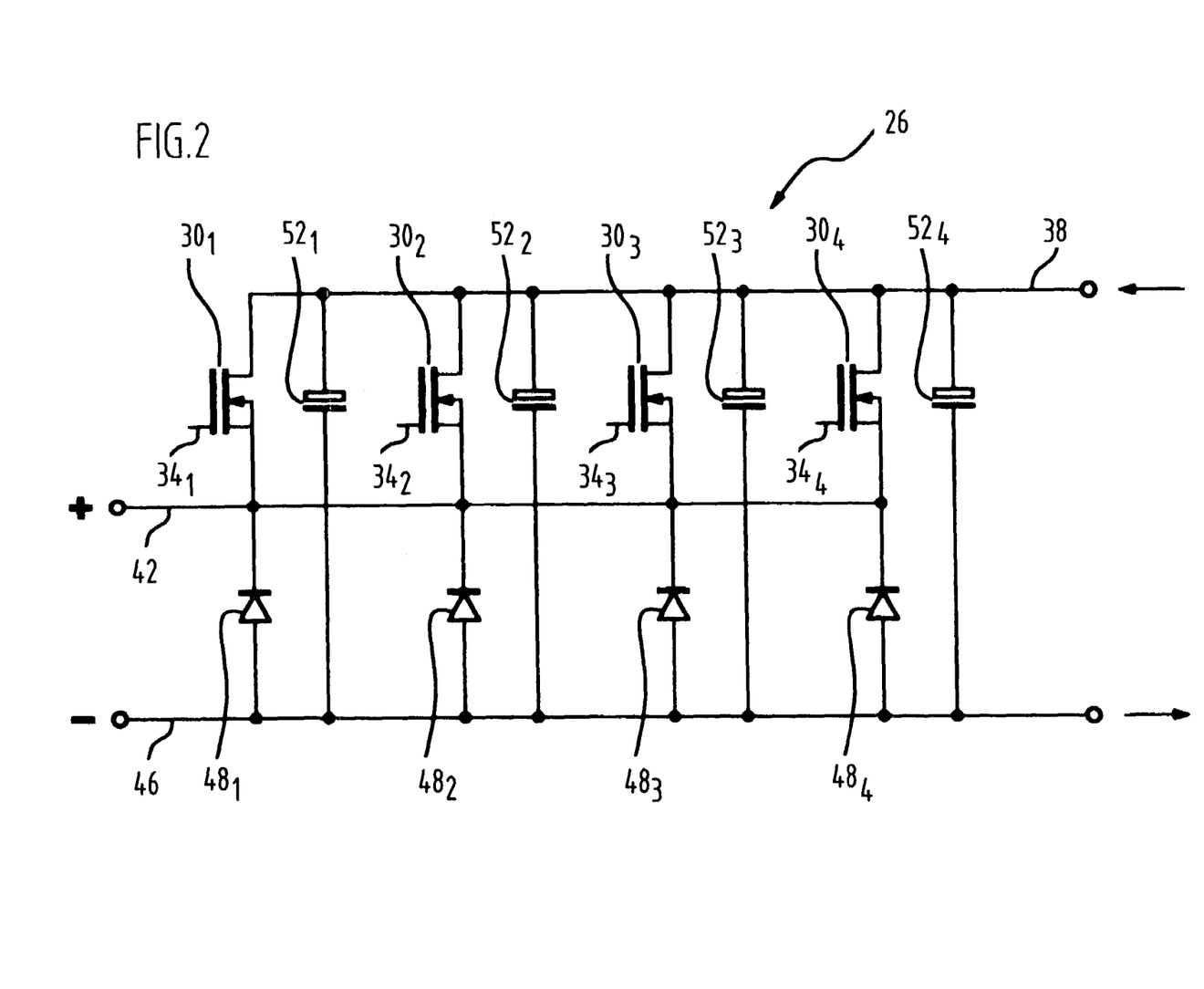
FIG. 2 shows a schematic illustration of an advantageous embodiment of an inventive power output stage for a load.

Furthermore, a respective interference suppression capacitor $52_1$ to $52_4$ is associated, for example, with each of the power switches $30_1$ to $30_4$ and these capacitors—as already explained—are connected electrically to the current connection carrier 38 on the network side and the current connection carrier 46 on the ground side.

In addition, each of the power switches $30_1$ to $30_4$ also has, for example, its own freewheeling diode $48_1$ to $48_4$ associated with it and these diodes are each located between the current connection carrier 42 on the load side and the current connection carrier 46 on the ground side.

It is, however, also conceivable to select the number of interference suppression capacitors 42 and/or the number of freewheeling diodes 48 independently of the number of power switches 30.

Since a power output stage 26 of this type operates with large amounts of current and relatively high switching frequencies, it is not only the switching connection of the individual components 30, 48, 52 which is decisive but also their bodily arrangement relative to one another which is as low in inductance as possible.

Figure 3:
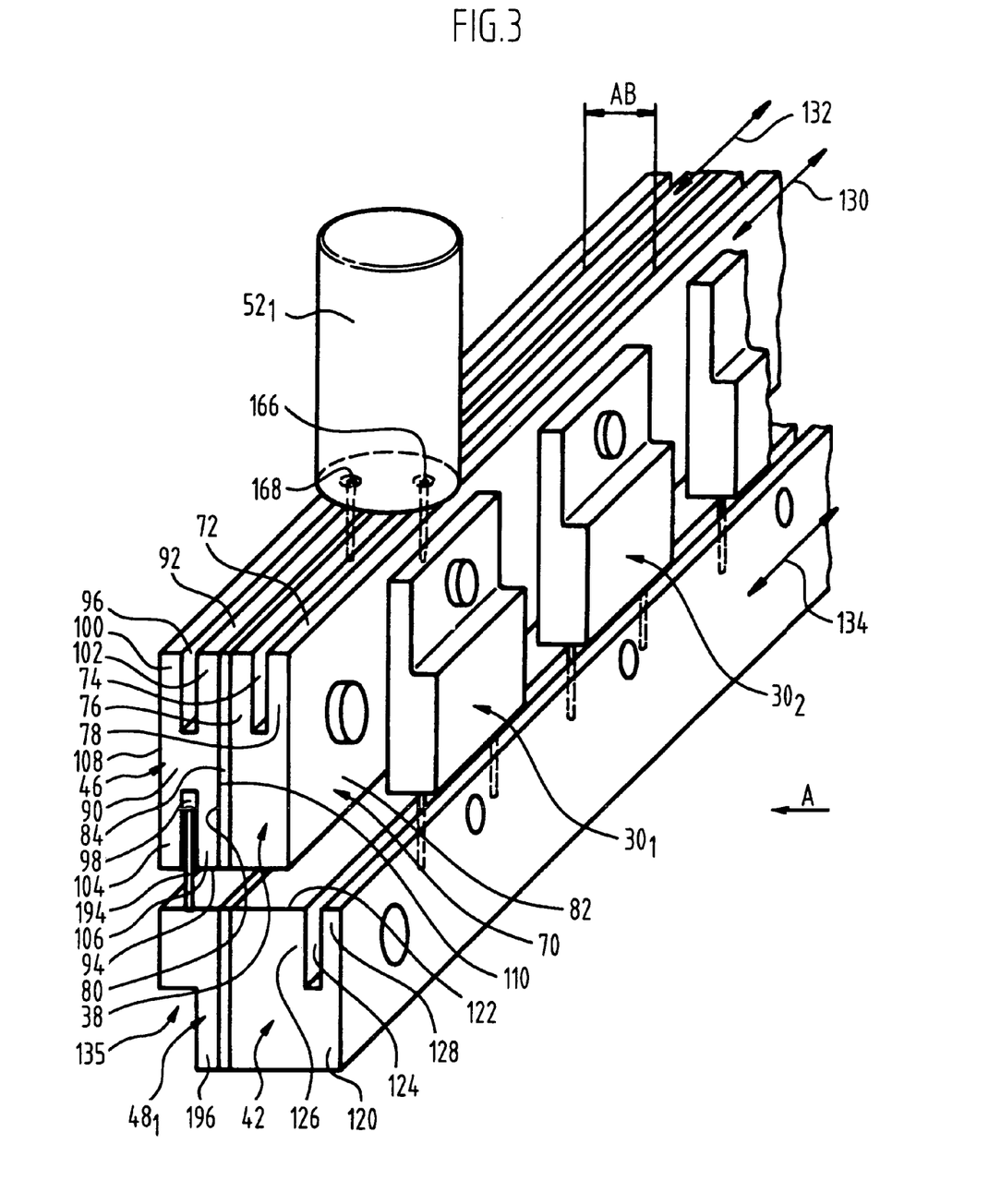
FIG. 3 shows a spatial illustration of a section of a circuit arrangement of the circuit according to FIG. 2.
Figure 4:
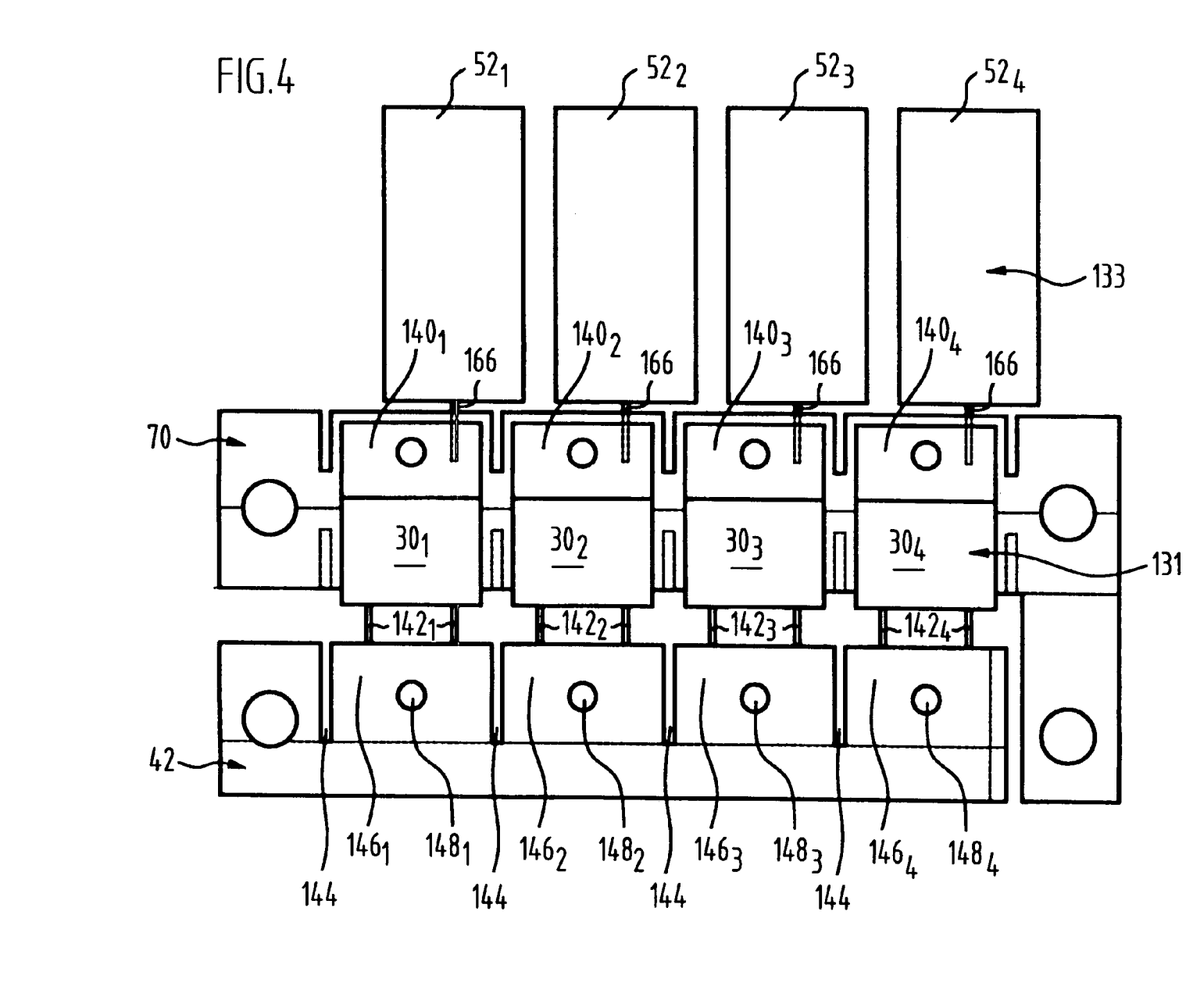
FIG. 4 shows a plan view in the direction of arrow A in FIG. 3.
Figure 5:
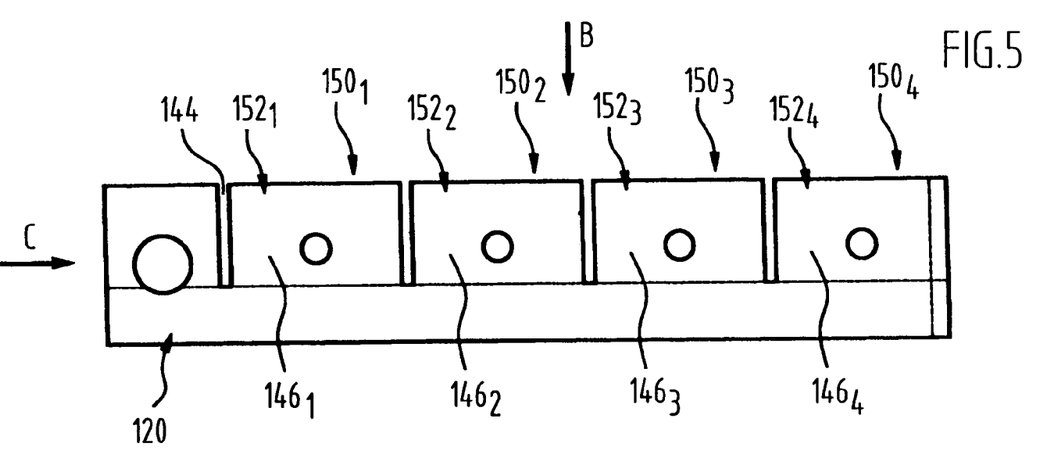
FIG. 5 shows an illustration of a current connection carrier on the load side viewed in the direction of arrow A in FIG. 3.
Figure 6:
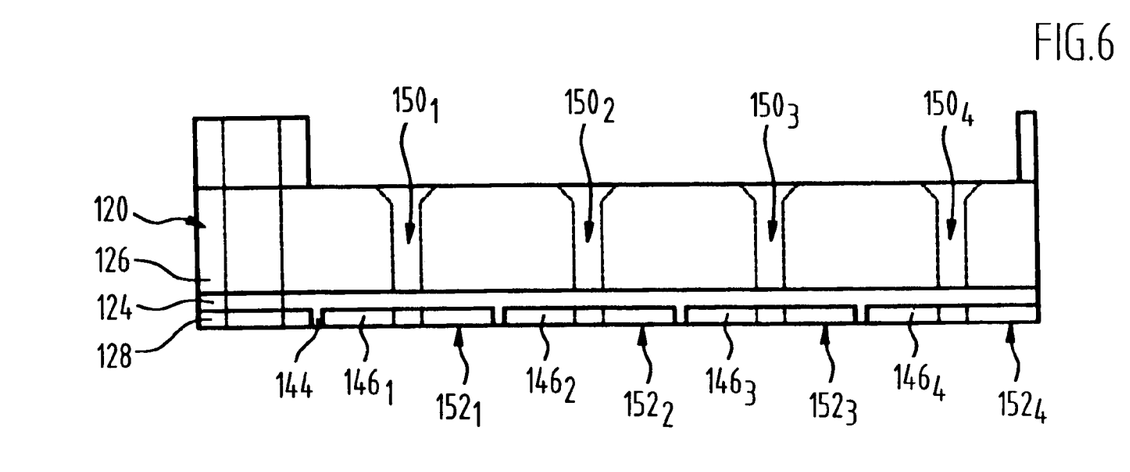
FIG. 6 shows a plan view of the current connection carrier on the load side in the direction of arrow B in FIG. 5.
Figure 7:
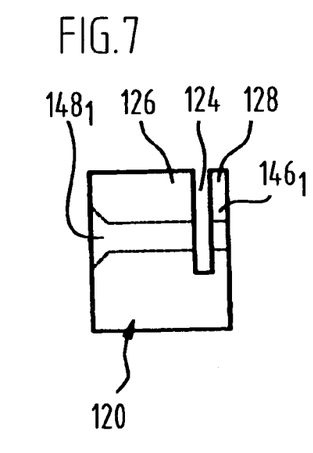
FIG. 7 shows a view of the current connection carrier on the load side in the direction of arrow C in FIG. 5.

As illustrated in FIGS. 3 and 4, the current connection carrier 38 on the network side is designed as a profiled rail 70 which is provided on a narrow side 72 with a groove 74 which dips into the profiled rail 70 proceeding from this narrow side and is limited on both sides by groove walls 76, 78.

Furthermore, the profiled rail 70 has broad sides 80, 82 which are located opposite one another, wherein the current connection carrier 46 on the ground side is held on the broad side 80 supported via an insulating member 84 and this current connection carrier is likewise designed as a profiled rail 90, into which a respective groove 96 and 98 dips proceeding from its narrow sides 92 and 94, respectively, which are located opposite one another, the grooves for their part being limited by groove walls, 100, 102 and 104, 106, respectively.

In this respect, the profiled rail 90 is preferably arranged such that its broad sides 108 and 110, respectively, extend parallel to the broad sides 80 and 82 and, for example, the broad side 110 abuts on the insulating member 84.

In addition, the current connection carrier 42 on the load side is also designed as a profiled rail 120 which likewise has a groove 124 which penetrates it proceeding from a narrow side 122 and is limited by groove walls 126 and 128.

The current connection carrier 38 on the network side, the current connection carrier 46 on the ground side and the current connection carrier 42 on the load side are preferably arranged in such a manner that their longitudinal directions 130, 132 and 134 extend essentially parallel to one another.

The power switches $30_1$ to $30_4$ are, as illustrated in FIG. 4, designed such that they have connection flanges $140_1$ to $140_4$ and abut with these connection flanges $140_1$ to $140_4$ on the broad side 82 of the profiled rail 70. As a result, all the power switches $30_1$ to $30_4$ which are connected in parallel are located in a row 131 extending parallel to the longitudinal directions 130 and 134 of the current connection carriers 38, 42.

Furthermore, the power switches $30_1$ to $30_4$ each have pairs of conductor elements $142_1$ to $142_4$ which are to be connected to the current connection carrier 42 on the load side, wherein the conductor elements $142_1$ to $142_4$ dip into the groove 124, which faces the current connection carrier 38 on the network side, of the profiled rail 120 which is comprised by the current connection carrier 42 on the load side.

In order to fix the individual pairs of conductor elements $142_1$ to $142_4$ in position in the groove 124, the groove wall 128 at least is subdivided into groove wall sections $146_1$ to $146_4$ forming clamping jaws by means of slits 144 proceeding from the narrow side 122 so that the individual groove wall sections $146_1$ to $146_4$ can be bent in the direction of the groove wall 126 independently of one another in order to clamp the pair of conductor elements 142 located between the respective groove wall section 146 and the groove wall 126 between the groove wall 126 and the respective groove wall section 146.

For example, the pair of conductor elements $142_1$ is clamped by the groove wall section $146_1$ between this and the groove wall 126.

In order to deform the groove wall sections $146_1$ to $146_4$ and clamp the pairs of conductor elements 142, each of the groove wall sections 146 can be acted upon by a tightening screw 148 which passes through the groove wall section 146 and the groove wall 126 and, for example, while being screwed into the groove wall sections 146 acts on these in the direction of the groove wall 126.

As a result, each of the groove wall sections 146₁ forms, together with the groove wall 126, a clamping connection 150₁ to 150₄, the clamping jaws of which represent the groove walls 126 and the respective groove wall section 146 and the groove 124 forms the receiving means for the conductor elements 142.

Altogether, the profiled rail 120 therefore represents a row of consecutive clamping members 152₁ to 152₄.

Figure 8:
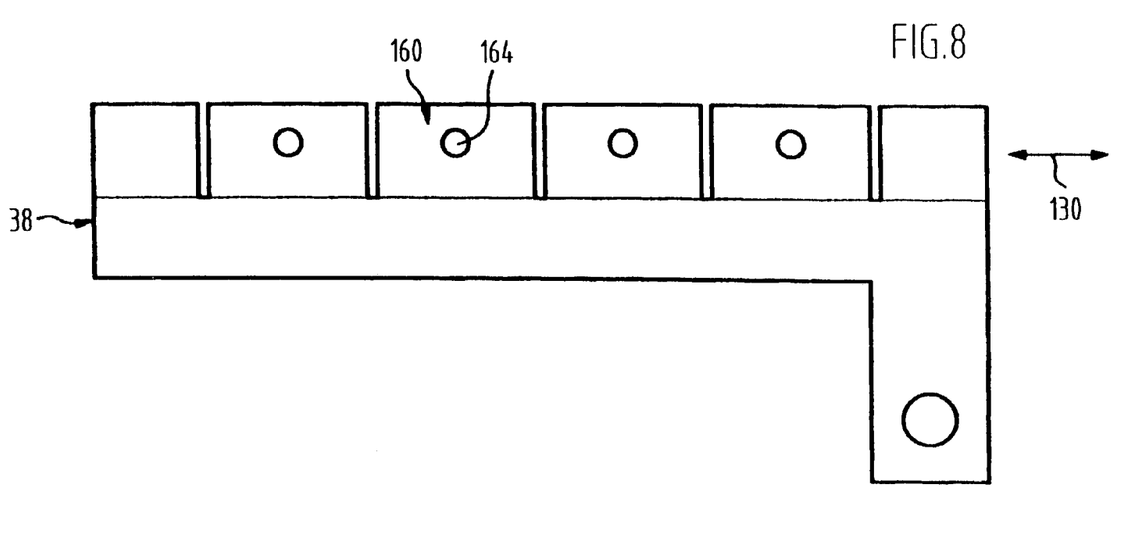
FIG. 8 shows a view similar to FIG. 5 of a current connection carrier on the network side.
Figure 9:
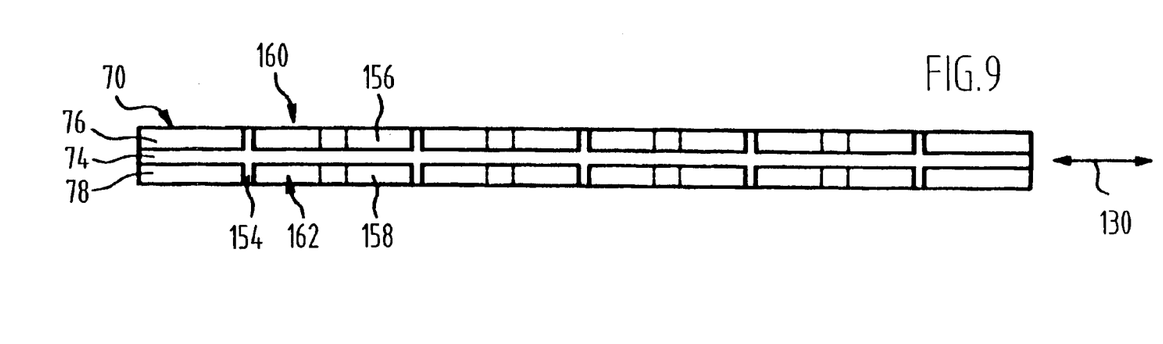
FIG. 9 shows a view similar to FIG. 6 of the current connection carrier on the network side.
Figure 10:
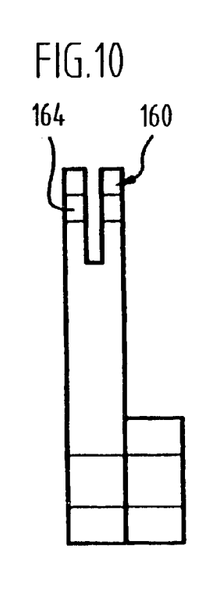
FIG. 10 shows a view similar to FIG. 7 of the current connection carrier on the network side.

As illustrated in FIGS. 8 to 10, the groove walls 76 and 78 of the profiled rail 70 are also divided into groove wall sections 156 and 158 by slits 154 passing through the entire profiled rail 70 transversely to its longitudinal direction 130 and these groove wall sections each form a clamping connection 160, the clamping member 162 of which is formed by the respective section of the profiled rail 70, wherein a tightening screw 164 is provided in order to clamp the groove wall sections 156 and 158 to one another.

Each of these clamping connections 160 serves the purpose of clamping a conductor element 166, illustrated in FIG. 4, of one of the interference suppression capacitors 52₁ to 52₄ and therefore of contacting it.

Figure 11:
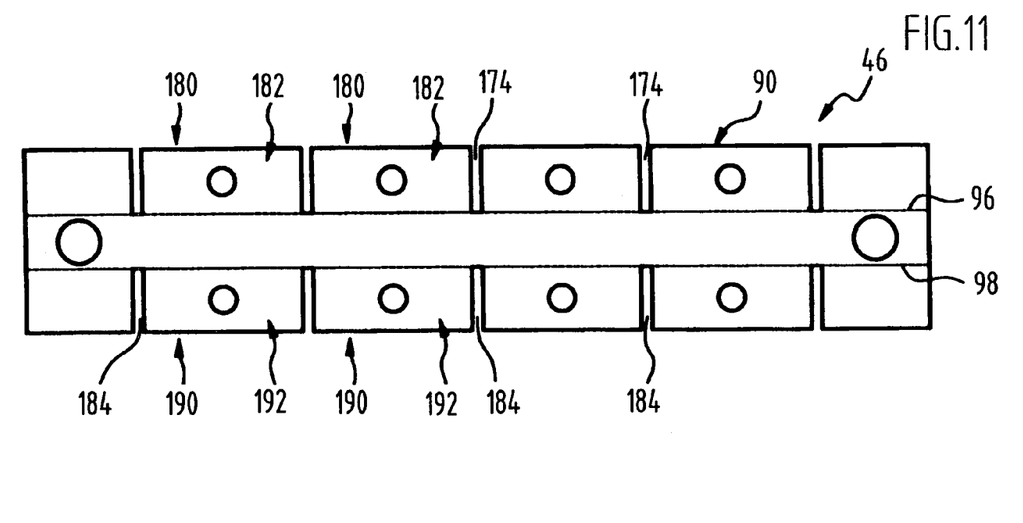
FIG. 11 shows a view similar to FIG. 5 of a current connection carrier on the ground side.
Figure 12:
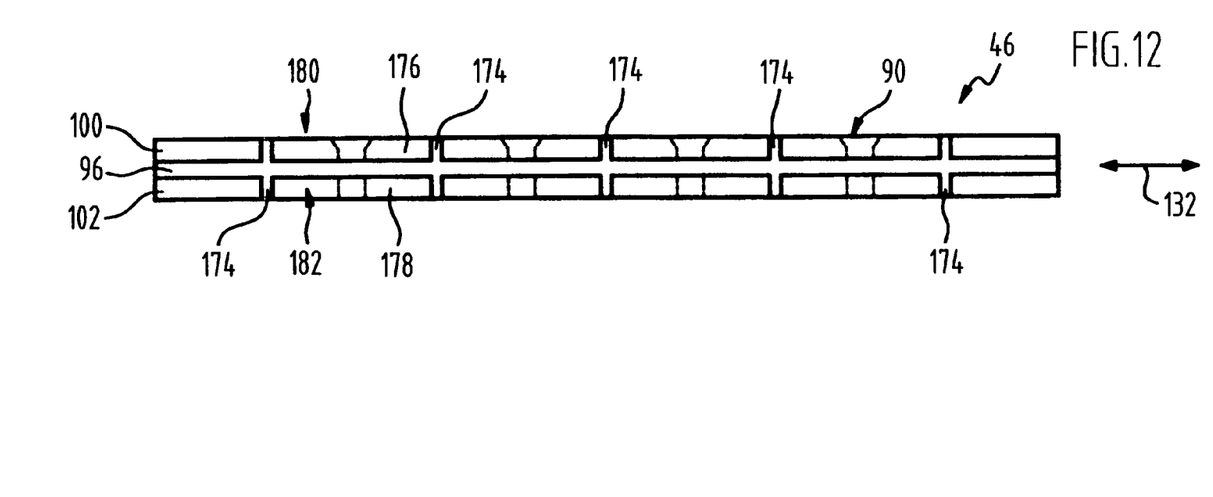
FIG. 12 shows a view similar to FIG. 6 of the current connection carrier on the ground side and FIG. 13 shows a view similar to FIG. 7 of the current connection carrier on the ground side.
Figure 13:
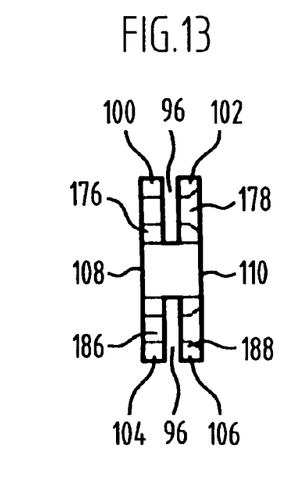

Another conductor element 168 of the interference suppression capacitors 52₁ to 52₄ can, as illustrated in FIGS. 11 to 13, be clamped in the groove 96 of the profiled rail 90, wherein the groove walls 100 and 102 are likewise subdivided by slits 174 into groove wall sections 176, 178 which form clamping jaws and form a clamping connection 180 with a clamping member 182 which is in a position to clamp the conductor element 168 of the respective interference suppression capacitor 52₁ to 52₄ by means of a clamping screw by drawing the groove wall sections 176 and 178 together.

In order to be able to arrange the interference suppression capacitors 52₁ to 52₄ in a row 133 extending parallel to the longitudinal directions 130 and 132, the clamping members 162 and 182 are likewise located in rows extending in the longitudinal directions 130 and 132 at a distance AB which corresponds to the distance between the conductor elements 166 and 168 exiting from the interference suppression capacitors 52₁ to 52₄ and the grooves 74 and 96 which form receiving means for the conductor elements 166 and 168 face the row 133 of interference suppression capacitors 52₁ to 52₄.

In addition, the groove walls 104 and 106 of the profiled rail 90 are also subdivided by slits 184 into groove wall sections 186 and 188 which form clamping jaws and are therefore in a position to form clamping connections 190 with clamping members 192, wherein conductor elements 194 of the freewheeling diodes 48 can be clamped with these clamping connections 190, as illustrated in FIG. 3, and these conductor elements can therefore be connected to the current connection carrier 46 on the ground side and, on the other hand, abut with a connection flange 196 on the profiled rail 120 and are connected to this.

In this respect, the connection flanges 196 are likewise preferably screwed to the profiled rail 120.

As a result, the freewheeling diodes 48₁ to 48₄ are also located in a row 135 extending parallel to the longitudinal directions 132 and 134.

As a result of the inventive parallel arrangement of the profiled rails 70, 90 and 120 and of the components 30, 48, 52 connected in parallel and arranged in rows 131, 133 and 135 parallel thereto, a compact construction of the power output stage 26 which requires, as a result, short line lengths between the individual components 30, 48, 52, can be realized with an optimum interference suppression effect of the interference suppression capacitors 52.

The invention claimed is:

1. A control device for loads connected to an electric supply network of a motor vehicle, comprising:
   a control signal generator for generating a pulse-width modulated control signal,
   at least one power output stage with at least one power switch for supplying a respective load, the power switch being adapted to be activated in a pulse-width modulated manner by the control signal applied to a control input thereof and the power switch having connections for connection to the supply network and the load, one of said connections being formed by at least one conductor element,
   a current connection carrier on a network side and a current connection carrier on a load side provided in the at least one power output stage, and
   the at least one conductor element of each of said at least one power switch being connected to one of the current connection carriers by means of a respective clamping connection.

2. A control device as defined in claim 1, wherein each of the at least one power switches has a connection flange as an additional connection and wherein the connection flange is connected to the respectively other current connection carrier.

3. A control device as defined in claim 2, wherein the connection flange abuts in a pressed manner on the respective current connection carrier.

4. A control device as defined in claim 1, wherein the clamping connection has a receiving means for the conductor element facing the other current connection carrier.

5. A control device as defined in claim 4, wherein several interference suppression capacitors are arranged in a row extending parallel to the current connection carriers.

6. A control device as defined in claim 1, wherein the current connection carrier on the network side and the current connection carrier on the load side extend parallel to one another.

7. A control device as defined in claim 6, wherein said at least one power switch comprises a plurality of power switches connected in parallel, said power switches being arranged in a row extending parallel to the current connection carriers.

8. A control device as defined in claim 1, wherein:
   a current connection carrier on a ground side is provided, and
   at least one interference suppression capacitor is provided between the current connection carrier on the network side and the current connection carrier on the ground side.

9. A control device as defined in claim 8, wherein the at least one interference suppression capacitor has two capacitor connections, at least one of said capacitor connections being designed as a conductor element and connected to one of the current connection carriers by means of at least one clamping connection.

10. A control device as defined in claim 9, wherein the other capacitor connection is designed as a conductor element and is connected to the other one of the current connection carriers by means of a respective clamping connection.

11. A control device as defined in claim 8, wherein the current connection carrier on the network side and the current connection carrier on the ground side are located next to one another in a spaced relationship.

12. A control device as defined in claim 11, wherein:
the clamping connections have a receiving means for the conductor elements; and
the clamping connections are arranged on the current connection carriers at a distance corresponding approximately to a distance between the conductor elements exiting from the at least one interference suppression capacitor.

13. A control device as defined in claim 11, wherein the current connection carrier on the network side and the current connection carrier on the ground side are insulated electrically in relation to one another by means of an insulating member.

14. A control device as defined in claim 1, wherein:
a current connection carrier on a ground side is provided; and
at least one free-wheeling diode is provided between the current connection carrier on the load side and the current connection carrier on the ground side.

15. A control device as defined in claim 14, wherein:
the at least one freewheeling diode has two diode connections, and
at least one of the diode connections is a conductor element and connected to one of the current connection carriers by means of a respective clamping connection.

16. A control device as defined in claim 15, wherein the other diode connection is a connection flange connected to the respectively other current connection carrier.

17. A control device as defined in claim 16, wherein the connection flange abuts in a pressed manner on the respective current connection carrier.

18. A control device as defined in claim 15, wherein the clamping connection has a receiving means facing the other current connection carrier.

19. A control device as defined in claim 15, wherein the current connection carrier on the load side and the current connection carrier on the ground side extend parallel to one another.

20. A control device as defined in claim 19, wherein said at least one freewheeling diode comprises a plurality of said freewheeling diodes connected in parallel, said freewheeling diodes being arranged in a row extending parallel to the current connection carriers.

21. A control device as defined in claim 1, wherein the clamping connection is formed by clamping jaws of a clamping member.

22. A control device as defined in claim 21, wherein the clamping jaws are integrally formed on the clamping member.

23. A control device as defined in claim 22, wherein the clamping member is formed by a section of a profiled rail having at least one groove and the clamping jaws are formed by groove walls arranged on both sides of the groove.

24. A control device as defined in claim 21, wherein each current connection carrier is provided with a plurality of said clamping members.

25. A control device as defined in claim 24, wherein the plurality of clamping members is formed by separate groove wall sections arranged on at least one side of a groove.

26. A control device as defined in claim 25, wherein the groove wall sections are formed by slits extending in a respective groove wall transversely to a longitudinal direction of the groove.

27. A control device as defined in claim 21, wherein the current connection carrier comprises a profiled rail forming the clamping members.

28. A control device for loads connected to an electric supply network of a motor vehicle, comprising:
a control signal generator for generating a pulse-width modulated control signal,
a power output stage with at least one power switch for supplying a respective load, the power switch being adapted to be activated in a pulse-width modulated manner by the control signal applied to a control input thereof and the power switch having connections for connection to the supply network as well as to the load, one of said connections being formed by at least one conductor element, and
a ground connection from the supply network to a unit providing the load, said ground connection being guided exclusively via the power output stage of the control device.

29. A control device as defined in claim 28, wherein the ground connection is guided via a current connection carrier of the control device on a ground side.

30. A control device as defined in claim 29, wherein a ground line is guided from the supply network to the current connection carrier on the ground side and a ground line is guided from the current connection carrier on the ground side to the unit providing the load.

* * * * *